(12) United States Patent
Wang et al.

(10) Patent No.: US 11,484,116 B2
(45) Date of Patent: Nov. 1, 2022

(54) FOLDABLE CABINET FRAMEWORK AND CABINET

(71) Applicant: Huawei Digital Power Technologies Co., Ltd., Shenzhen (CN)

(72) Inventors: Yongling Wang, Dongguan (CN); Xiong Hu, Shenzhen (CN); Yejian Yao, Shenzhen (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/136,461

(22) Filed: Dec. 29, 2020

(65) Prior Publication Data

US 2021/0120949 A1 Apr. 29, 2021

Related U.S. Application Data

(63) Continuation of application No. PCT/CN2019/111935, filed on Oct. 18, 2019.

(30) Foreign Application Priority Data

Oct. 22, 2018 (CN) .......................... 201811231639.5

(51) Int. Cl.
*A47B 43/00* (2006.01)
*H05K 5/02* (2006.01)
*H05K 7/14* (2006.01)

(52) U.S. Cl.
CPC ........... *A47B 43/00* (2013.01); *H05K 7/1488* (2013.01); *H05K 5/0217* (2013.01)

(58) Field of Classification Search
CPC ...... A47B 43/00; A47B 47/00; H05K 7/1488; H05K 5/0217
See application file for complete search history.

(56) References Cited

U.S. PATENT DOCUMENTS 5,593,046 A 1/1997 Katsuura et al.
8,363,998 B2 * 1/2013 Newman ................ H04Q 1/062
385/135

(Continued)

FOREIGN PATENT DOCUMENTS

CN 101290402 A 10/2008
CN 202551517 U 11/2012

(Continued)

*Primary Examiner* — Kimberley S Wright
(74) *Attorney, Agent, or Firm* — Womble Bond Dickinson (US) LLP

(57) ABSTRACT

A foldable cabinet framework includes two side frames, a first beam body, and a second beam body, where two opposite ends of each of the first and second beam bodies are respectively connected to the two side frames. The first beam body and the second beam body each include a hinged part, and when the first beam body and the second beam body are in a straight state, the first beam body and the second beam body are supported between the two side frames, so that the two side frames are spaced apart and symmetrically disposed. The first beam body and the second beam body enclose a framework of a three-dimensional structure. The first beam body and the second beam body are folded by using the hinged part; and after the first beam body and the second beam body are folded, the two side frames are superposed with each other.

16 Claims, 7 Drawing Sheets

(56) References Cited

U.S. PATENT DOCUMENTS

| | | | | |
|---|---|---|---|---|
| 8,413,827 | B2 * | 4/2013 | Taylor | H04Q 1/021 |
| | | | | 211/195 |
| 10,342,331 | B2 * | 7/2019 | Kuffel | A47B 43/00 |
| 2006/0103270 | A1 * | 5/2006 | Bergesch | G06F 1/181 |
| | | | | 312/223.1 |
| 2008/0310083 | A1 | 12/2008 | Watts | |
| 2010/0078529 | A1 * | 4/2010 | Taylor | H04Q 1/06 |
| | | | | 248/68.1 |
| 2018/0263367 | A1 * | 9/2018 | Kuffel | A47B 43/00 |

FOREIGN PATENT DOCUMENTS

| | | |
|---|---|---|
| CN | 203251552 U | 10/2013 |
| CN | 203789447 U | 8/2014 |
| CN | 203914413 U | 11/2014 |
| CN | 204090374 U | 1/2015 |
| CN | 204317944 U | 5/2015 |
| CN | 204859824 U | 12/2015 |
| CN | 205038575 U | 2/2016 |
| CN | 206061411 U | 3/2017 |
| CN | 206473038 U | 9/2017 |
| CN | 107772828 A | 3/2018 |
| CN | 107946950 A | 4/2018 |
| CN | 108315976 A | 7/2018 |
| CN | 109348653 A | 2/2019 |
| JP | 2005045056 A | 2/2005 |
| JP | 2012025213 A | 2/2012 |

* cited by examiner

FOLDABLE CABINET FRAMEWORK AND CABINET

CROSS-REFERENCE TO RELATED APPLICATIONS

This application is a continuation of International Application No. PCT/CN2019/111935, filed on Oct. 18, 2019, which claims priority to Chinese Patent Application No. 201811231639.5, filed on Oct. 22, 2018. The disclosures of the aforementioned applications are hereby incorporated by reference in their entireties.

TECHNICAL FIELD

The present disclosure relates to the field of cabinet technologies, and in particular, to a foldable cabinet framework and a cabinet.

BACKGROUND

Cabinets of existing network service devices (such as a server cabinet and a network cabinet) are mostly empty cabinets at delivery, and a server and the like are installed inside the cabinets in the case of an application scenario. Cabinet frameworks are core support components of cabinets. Usually, the cabinet frameworks are of an integral structure and have a relatively large volume. The cabinets are mostly transported in an integrated cabinet form. Costs of the transportation in the integrated cabinet form are relatively high because of a relatively large volume. In order to reduce the transportation costs, the cabinets are disassembled for transportation, and are then assembled on site. However, the cabinet frameworks are assembled with high precision, which increases labor costs of on-site assembling and leads to low efficiency.

SUMMARY

Embodiments of this disclosure provide a foldable cabinet framework and a cabinet for ease of transportation and assembly.

A foldable cabinet framework provided in an embodiment of the present disclosure is used in a cabinet such as a server cabinet, a network cabinet, or a console, is used as a core support of the cabinet, and forms a receiving space of a box structure with a door plate and the like of the cabinet. The cabinet framework includes two side frames, a first beam bodies, and a second beam bodies, where two opposite ends of the first beam body are respectively connected to the two side frames, two opposite ends of the second beam body are respectively connected to the two side frames, and the first beam body and the second beam body each include a hinged part.

The first beam body and the second beam body each include a hinged part, and when the first beam body and the second beam body are in a straight state, the first beam body and the second beam body are supported between the two side frames, so that the two side frames are spaced apart and symmetrically disposed, and the first beam body, the second beam body, and the two side frames enclose a framework of a three-dimensional structure. The first beam body and the second beam body are folded by using the hinged part, and after the first beam body and the second beam body are folded, the two side frames are superposed with each other. When the first beam body and the second beam body are in the straight state, it means that the first beam body and the second beam body are straight rod bodies and are not bent, and length extension lines of the first beam body and the second beam body are perpendicular to opposite surfaces of the two side frames. It may be understood that both folding and bending in this embodiment are used to describe that at least two parts of the first beam body and the second beam body are moved oppositely to form a specific relative angle. When the first beam body and the second beam body are supported between the two side frames, extension directions of the first beam body and the second beam body are perpendicular to the surfaces of the side frames. The superposing means that one of the two side frames is stacked on the other side frame, and the two side frames may be completely overlapped, or may be partially overlapped. In this embodiment, the two side frames are partially overlapped, and extension directions of a part of the first beam body and a part of the second beam body that are folded are parallel to the surfaces of the side frames. After the first beam body and the second beam body are bent or straightened, such a state may be maintained by using a friction force, or such a state may be maintained by using a clamping apparatus. The first beam body and the second beam body each include one or more hinged parts. In this embodiment, one hinged part is used as an example for description. In an embodiment in which there are a plurality of hinged parts, the beam body is divided into a multi-segment structure by the hinged parts and may be bent a plurality of times, to adapt to framework structures of different volumes.

The beam bodies of the foldable cabinet framework in this embodiment of the present disclosure may be bent so that the side frames can be stacked in layers. To be specific, the framework of the three-dimensional structure is changed into a two-dimensional form to implement horizontal transportation of the cabinet framework, and it is unnecessary to occupy too much space in a transportation process, thereby improving transportation efficiency. In addition, during assembly, the cabinet framework can be assembled as long as the first beam body and the second beam body are straightened, and only other board bodies or seals need to be assembled, thereby reducing assembly steps, greatly improving assembly efficiency, and further reducing costs of the cabinet. An angle at which the first beam body and the second beam body described in this embodiment can be bent ranges from 0 degrees to 90 degrees, but a specific tolerance is allowed.

Further, after the first beam body and the second beam body are bent, the two side frames are completely overlapped, or the two side frames are partially overlapped. The first beam body and the second beam body each include at least one of the hinged parts, where one of the hinged parts divides the first beam body or the second beam body corresponding to the hinged part into two relatively bendable parts.

Further, in an embodiment, there are two hinged parts, and the two side frames are partially overlapped. The first beam body and the second beam body each include two connection bases and a main beam connected between the two connection bases, and the two connection bases are respectively connected to the two side frames. The hinged part includes a rotating body, a first rotor, and a second rotor, where the first rotors or the second rotors are disposed at two opposite ends of the main beam, and for the second rotor or the first rotor, the second rotor extends from an end part of the connection base towards the first rotor; and the first rotor and the second rotor are rotatably connected by using the rotating body. In an embodiment, the first rotor is disposed at the two opposite ends of the main beam, and for the second rotor, the second rotor extends from the end part of the connection base towards the first rotor. The first rotor and the second rotor may rotate relative to the rotating body, thereby driving the main beam to bend relative to the connection base. When the main beam is bent 90 degrees, the two side frames are stacked, and an extension direction of the main beam is parallel to the surfaces of the side frames. In this embodiment, the two connection bases are used to be rotatably connected to the main beam, thereby ensuring bearing strength of the main beam.

In an embodiment, the second rotor includes two side walls spaced apart and disposed opposite to each other and an insertion groove disposed between the two side walls, the insertion groove includes an insertion opening that faces the first rotor, a first turning opening, and a second turning opening, and the first turning opening and the second turning opening face directions perpendicular to an opening of the insertion opening and face opposite directions.

The first rotor is inserted into the insertion groove from the insertion opening and is rotatably connected to the two side walls of the second rotor by using the rotating body, and the first rotor rotates from the insertion opening to the first turning opening or the second turning opening, so that the main beam is bent relative to the connection base. In this embodiment, the first rotor is flat-shaped, is inserted between the two side walls from the insertion opening and is parallel to the side walls, and the rotating body is a rotating shaft or a pin, penetrates through the first rotor and the two side walls, and enables the first rotor to rotate relative to the two side walls. Alternatively, the two side walls may rotate relative to the first rotor. Certainly, a friction force may be set between the first rotor and the side walls of the second rotor. Alternatively, a structure that increases a friction force is disposed between the rotating shaft and the side panel, so as to implement positioning of the main beam and the connection base in a bent or straightened state. In this embodiment, the second rotor on the connection base with a shorter length is disposed in a way that two side walls are used to clamp the first rotor. From a perspective of force bearing, the two side walls are of a U-shaped structure to receive the first rotor in a shape similar to I, so that bearing strength of the second rotor can be ensured, and the entire connection base and the main beam have sufficient strength.

In an embodiment, different from the foregoing embodiment, a structure of the first rotor is the same as that of the second rotor. A side wall of the first rotor is inserted into the insertion groove of the second rotor from the insertion opening of the second rotor, a side wall of the second rotor is inserted into an insertion groove of the first rotor, and the rotating body is rotatably connected to the two side walls of the second rotor and two side walls of the first rotor.

The first rotor rotates relative to the second rotor, and a side wall of the second rotor rotates from an insertion opening of the first rotor to a first turning opening or a second turning opening of the first rotor; and a side wall of the first rotor rotates from the insertion opening of the second rotor to the first turning opening or the second turning opening of the second rotor, so that the main beam is bent relative to the connection base. In an embodiment, the first rotor includes an insertion groove facing the second rotor and two side walls, the side walls of the first rotor and the second rotor form U-shaped structures, and the two U-shaped structures are plug-connected to each other, so as to form a hinged part that is securely hinged.

Further, a turning limiting surface that is disposed opposite to the insertion opening is disposed between the two side walls, the first rotor includes a first limiting surface and a second limiting surface connected to the first limiting surface at an included angle, and the first rotor is located in the insertion groove. The turning limiting surface is opposite to or abuts against the first limiting surface, and abuts against the second limiting surface after the first rotor rotates. The limiting surface may be disposed to prevent the beam body from being damaged due to an excessively large rotation angle when the main beam and the connection base rotate.

When the first rotor is flat-shaped, the first limiting surface is a free end face that is of the first rotor and that is away from the main beam, the second limiting surface is a side surface connected to the first limiting surface at an included angle, and the first limiting surface and the second limiting surface are outer surfaces of the first terminal. The included angle between the first limiting surface and the second limiting surface is 90 degrees, or the first limiting surface and the second limiting surface are connected at an arched angle. In an embodiment, the first limiting surface is connected to the second limiting surface at the arched angle, and when the first rotor rotates in the insertion groove of the second rotor, the arched angle rotates relative to the turning limiting surface. The arched angle may improve a degree of smoothness of the rotation of the first rotor. When the first rotor includes two side walls, the first limiting surface and the second limiting surface are disposed on a side wall inserted into the insertion groove of the second rotor.

In an embodiment, the first rotor and the second rotor each are flat-shaped, and each are provided with a bearing. The rotating body is a rotating shaft, the rotating shaft is installed on the bearing to implement rotation of the first rotor relative to the second rotor, and the rotating shaft and the bearing are positioned by using a friction force. Certainly, the first rotor and the second rotor may be positioned by using a clamping part.

In an embodiment, the first rotor includes a body and a sphere located at a free end of the body, the second rotor includes two side walls spaced apart and disposed opposite to each other, opposite surfaces of the two side walls are provided with an arched limiting groove jointly formed by being concavely disposed in the side walls, and the limiting groove is a three-way opening groove. The sphere of the first rotor is rotatably installed in the limiting groove by using a rotating body that penetrates through the side wall, and can rotate in the limiting groove. The body protrudes from an opening that is of the limiting groove and that faces the first rotor, and the first rotor rotates from the opening to another opening of the three-way opening, so that the main beam is bent relative to the connection base. The sphere rotates in the arched limiting groove, which may increase a degree of smoothness of the rotation.

Further, the hinged part includes a first clamping body disposed on the first rotor and a second clamping body disposed on the second rotor, the first beam body and the second beam body are supported between the two side frames, and the first clamping body and the second clamping body perform clamping to limit the main beam to be bent relative to the two connection bases by using the hinged part. The first clamping body and the second clamping body can perform clamping to implement a straight line connection between the main beam and the connection bases, namely, a function of pre-clamping and positioning after a beam body is straightened, so that the main beam and the connection bases can be kept in a straight line state. In this way, it is convenient for assembly personnel to fasten the first rotor and the second rotor by using a screw or the like, thereby facilitating assembly and also ensuring assembly precision.

The first clamping body or the second clamping body is an elastic body, one end of the elastic body is bent to form a protrusion, and the second clamping body or the first clamping body corresponding to the elastic body is provided with a clamping groove for clamping the protrusion; or the first clamping body or the second clamping body is an elastic retaining ring, the second clamping body or the first clamping body corresponding to the elastic retaining ring is a boss, and the elastic retaining ring is sleeved on the boss. In this embodiment, the first clamping body is an elastic body, one end of the elastic body is bent to form a protrusion, the other end of the elastic body is fastened to a face that is of the first rotor and that faces a rotation direction, and the second clamping body is a clamping groove, and is concavely disposed on a face that is of the second rotor and that is opposite to the rotation direction of the first rotor. Specifically, as in Embodiment 2, the elastic body is fastened on a side surface that is of the first rotor and that is opposite to the second limiting surface, and the clamping groove is concavely disposed on a side of the first turning opening of the insertion groove of the second rotor. After the main beam recovers to an unbent state, the protrusion of the elastic body is clamped in the clamping groove.

Further, in another embodiment, the main beam is limited to the two connection bases by using a friction force, thereby simplifying a structure.

In an embodiment, there are two first beam bodies and two second beam bodies. Each of the side frames includes a side panel and columns disposed on two opposite edges of a surface of the side panel. The three-dimensional framework is a cube. The two first beam bodies, the two second beam bodies, the columns of the two side frames are connected to form a frame with eight edges of the cube, and then pass through. Specifically, the two side frames are disposed opposite to each other, the four columns are spaced apart parallel to each other, the two first beam bodies each are connected to one end of the columns of the two side frames and located on a same side, and the two second beam bodies each are connected to the other end of the columns of the two side frames and located on a same side. In this case, the first beam body and the second beam body are perpendicular to the columns, so as to form a hollow frame structure of three-dimensional rectangles with the columns, and connection positions are located at eight angle positions of the rectangles. The superposing of the two side frames specifically means that two side panels are stacked, the first beam body and the second beam body are located between the two side frames, and the bent main beams are disposed parallel to the columns. Beams and columns of the framework in this embodiment are placed in a vertical direction. Castors are disposed at the bottom of the side frames, and are configured to drive the framework to move.

Further, the connection base and the column are integrally formed, or are detachably connected. When the connection base and the column are integrally formed, processing of the connection base is facilitated. When the connection base and the column are detachably connected, the connection base may be first assembled with the main beam by using the hinged part and then assembled with the side frame, so as to facilitate assembly of the first beam body and the second beam body.

Further, the cabinet includes a flexible panel connected between the two side frames, where the flexible panel includes several elastic seals disposed side by side, and when the two side frames are superposed with each other, the elastic seals are freely deformed. The two side frames are disposed opposite to each other, columns of one side frame are parallel and opposite to columns of the other side frame to form a frame door of the framework, and the flexible panel is located on an inner side of the frame door of the framework. The elastic seal is an elastic steel rod, and two ends of the elastic seal are respectively fastened to two side frames; or the elastic seal is made of a spring or a flexible material, and is connected to a side frame by using a universal rotating shaft.

An embodiment of the present disclosure further provides a cabinet. The cabinet includes the foregoing foldable cabinet framework, a top plate, a bottom plate, a front door, and a rear door, where the front door and the rear door are installed between the two side frames and are disposed opposite to each other, and enclose an accommodation space with the side frames, and the top plate and the bottom edge are used to package the accommodation space for accommodating network communications devices such as a server and a console.

The cabinet framework according to the present disclosure has a bendable beam body, so that the side frames may be superposed to fold the framework, thereby changing the cabinet framework from a three-dimensional structure to a horizontal folding structure, and facilitating transportation and assembly.

BRIEF DESCRIPTION OF DRAWINGS

To describe the technical solutions in the embodiments of the present disclosure or in the prior art more clearly, the following briefly describes the accompanying drawings for describing the embodiments or the prior art. Apparently, the accompanying drawings in the following description show merely some embodiments of the present disclosure, and a person of ordinary skill in the art may derive other drawings from these accompanying drawings without creative efforts.

DESCRIPTION OF EMBODIMENTS

Figure 1:
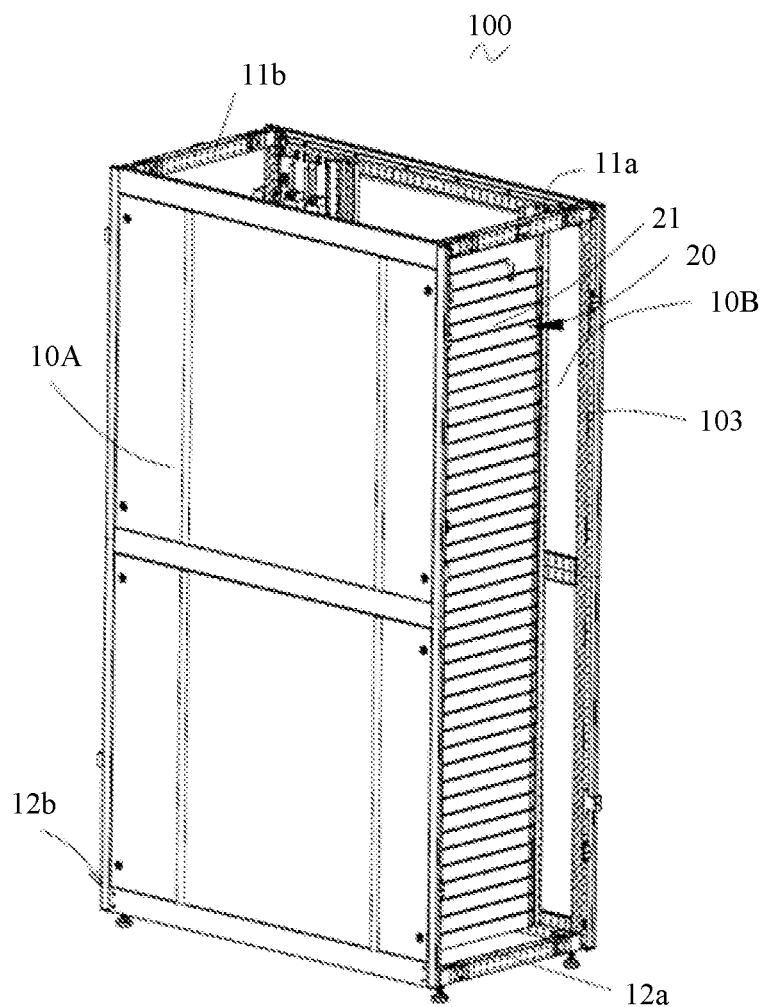
FIG. 1 is a schematic diagram of a three-dimensional structure of a foldable cabinet framework according to an embodiment of the present disclosure, where a flexible panel is included.

The following clearly and completely describes the technical solutions in the embodiments of the present disclosure with reference to the accompanying drawings in the embodiments of the present disclosure. Apparently, the described embodiments are merely some rather than all of the embodiments of the present disclosure. All other embodiments obtained by a person of ordinary skill in the art based on the embodiments of the present disclosure without creative efforts shall fall within the protection scope of the present disclosure.

A foldable cabinet framework provided in an embodiment of the present disclosure is used in a cabinet such as a server cabinet, a network cabinet, or a console, is used as a core support of the cabinet, and forms a box structure having a receiving space with a door plate and the like of the cabinet. The cabinet framework includes two side frames, a first beam bodies, and a second beam bodies, where two opposite ends of the first beam body are respectively connected to the two side frames, two opposite ends of the second beam body are respectively connected to the two side frames, and the first beam body and the second beam body each include a hinged part.

The first beam body and the second beam body each include a hinged part, and when the first beam body and the second beam body are in a straight state, the first beam body and the second beam body are supported between the two side frames, so that the two side frames are spaced apart and symmetrically disposed, and the first beam body, the second beam body, and the two side frames enclose a framework of a three-dimensional structure. The first beam body and the second beam body are folded by using the hinged part, and after the first beam body and the second beam body are folded, the two side frames are superposed with each other.

Further, after the first beam body and the second beam body are bent, the two side frames are completely overlapped, or the two side frames are partially overlapped. The first beam body and the second beam body each include at least one of the hinged parts, where one of the hinged parts divides the first beam body or the second beam body corresponding to the hinged part into two relatively bendable parts. The superposing of the two side frames means that one of the two side frames are stacked on the other side frame, and the first beam body and the second beam body partially rotate to a position outside the two side frames. In a transportation process of the cabinet framework, the two side frames are superposed with each other. In a use process, the first beam body and the second beam body are supported between the two side frames, and the two side frames, the first beam body, and the second beam body form a three-dimensional framework. In addition, after the first beam body and the second beam body are supported between the two side frames, the first beam body and the second beam body are locked by using a locking structure, and thus cannot be bent. In this embodiment, there are two hinged parts, and the two side frames are partially overlapped.

The beam bodies of the foldable cabinet framework in this embodiment of the present disclosure may be bent so that the side frames can be stacked in layers. To be specific, the framework of the three-dimensional structure is changed into a two-dimensional form to implement horizontal transportation of the cabinet framework, and it is unnecessary to occupy too much space in a transportation process, thereby improving transportation efficiency. In addition, during assembly, the cabinet framework can be assembled as long as the first beam body and the second beam body are straightened, and only other board bodies or seals need to be assembled, thereby reducing assembly steps, greatly improving assembly efficiency, and further reducing costs of the cabinet.

The following describes in detail the foldable cabinet framework according to the present disclosure with reference to specific embodiments.

Figure 2:
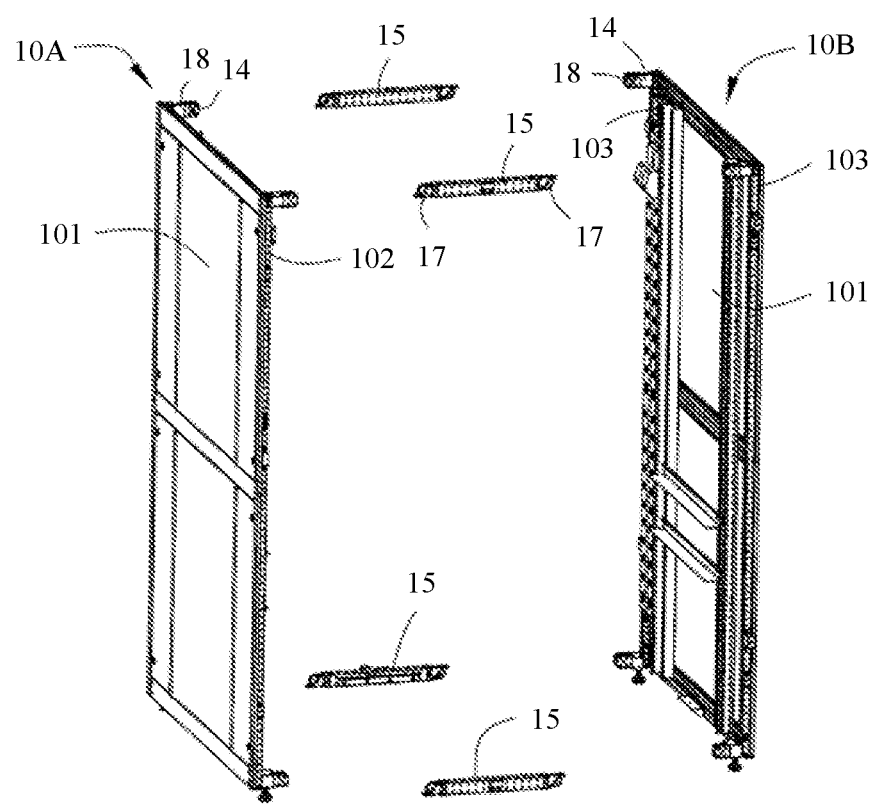
FIG. 2 is a schematic exploded view of the cabinet framework shown in FIG. 1, where a decomposed hinged part is included.

Referring to FIG. 1 and FIG. 2, the cabinet framework 100 is a cube in a three-dimensional state (namely, a use state), and is specifically a cuboid box structure. There are two first beam bodies and two second beam bodies, and the two side frames are spaced apart and disposed opposite to each other and are supported by the first beam body and the second beam body to form a cuboid framework structure. The two first beam bodies, the two second beam bodies, and the columns of the two side frames are connected to form a frame with eight edges of the cube, and are connected and fastened by using the side frames.

In an embodiment, the two side frames are respectively a side frame 10A and a side frame 10B, the side frame 10A and the side frame 10B are rectangular flat-shaped, and the side frame 10A and the side frame 10B each include a side panel 101, columns 102 are disposed on two opposite edges of a surface of the side panel 101 of the side frame 10A, columns 103 are disposed on two opposite edges of a surface of the side panel 101 of the side frame 10B, and the two columns 102 are respectively disposed parallel and opposite to the two columns 103. A side edge of the side panel located between the two columns 102 may be considered as another four beams of a cuboid box framework, or the two columns 102 may be connected by using additional beams.

In an embodiment, there are two first beam bodies and two second beam bodies, namely, a first beam body 11a and a first beam body 11b, and a second beam body 12a and a second beam body 12b. The first beam body 11a and the first beam body 11b, and the second beam body 12a and the second beam body 12b are both connected between the two side frames, and the first beam body 11a and the first beam body 11b are disposed parallel and spaced apart. The second beam body 12a and the second beam body 12b are disposed parallel and spaced apart, the first beam body 11a and the second beam body 12a are disposed parallel and spaced apart, the first beam body 11b and the second beam body 12b are disposed parallel and spaced apart, and the first beam body 11a and the first beam body 11b, and the second beam body 12a and the second beam body 12b have a same extension direction, and are located at four vertex angle positions of a rectangle from the perspective of the extension direction. In this embodiment, the first beam body and the second beam body are beams of the cabinet framework. Certainly, in other embodiments, the first beam body and the second beam body may be columns of the framework.

In an embodiment, the side frame 10A and the side frame 10B are disposed opposite to each other, the four columns are spaced apart parallel to each other, the two first beam bodies each are connected to one end of the columns of the two side frames and located on a same side, and the two second beam bodies each are connected to the other end of the columns of the two side frames and located on a same side. In this case, the first beam body and the second beam body are perpendicular to the columns. Specifically, located on a same side of the side frame 10A and the side frame 10B, two opposite ends of the first beam body 11a are respectively connected to one end of a column 102 and one end of a column 103, two opposite ends of the first beam body 11b are respectively connected to one end of the other column 102 and one end of the other column 103, two opposite ends of the second beam body 12a are respectively connected to one end of a column 102 and one end of a column 103, and two opposite ends of the second beam body 12b are respectively connected to one end of the other column 102 and one end of the other column 103, so as to form a hollow frame structure with the columns, and connection positions are located at the eight cuboid angle positions.

In an embodiment, when the first beam body 11a and the first beam body 11b, and the second beam body 12a and the second beam body 12b are supported between the side frame 10A and the side frame 10B, extension directions are perpendicular to the surfaces of the side panels 101 of the side frame 10A and the side frame 10B. That the side frame 10A and the side frame 10B are superposed specifically means that the two side panels 101 are stacked. Bent parts of the first beam body 11a and the first beam body 11b are disposed in an overlapping manner with the columns 103, and bent parts of the second beam body 12a and the second beam body 12b are disposed in an overlapping manner with the columns 103. Castors are disposed at the bottom of the side panels 101 of the side frame 10A and the side frame 10B, and are configured to drive the framework to move. After the first beam body and the second beam body are bent or straightened, such a state may be maintained by using a friction force, or such a state may be maintained by using a clamping apparatus.

In another embodiment, when there is one first beam body and one second beam body, the first beam body and the second beam body are connected to middle positions of the side panels 101 of the side frame 10A and the side frame 10B and are symmetrically disposed, provided that the side frame 10A and the side frame 10B can be supported, and such a structure is stable after a door panel and the like is assembled.

Figure 3:
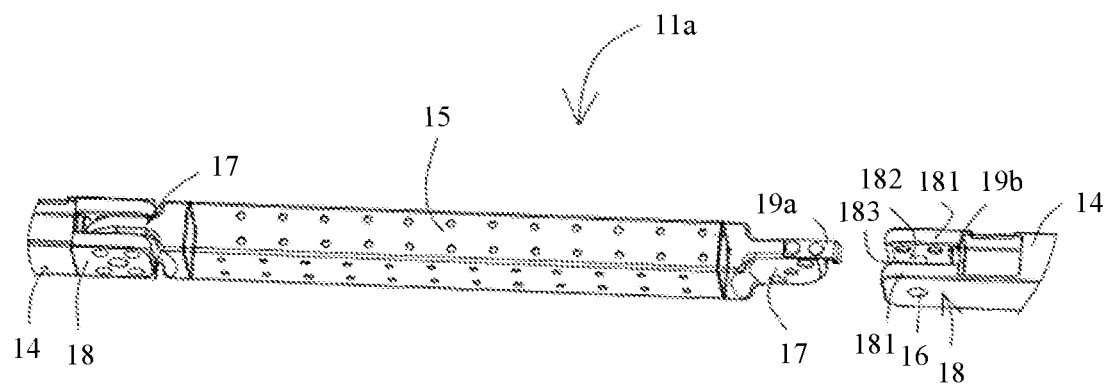
FIG. 3 is a schematic structural diagram of a beam body of the cabinet framework shown in FIG. 1, where a main beam and one connection base are in a decomposed state.

Referring to FIG. 3, the first beam body and the second beam body each include one or more hinged parts. In this embodiment, two hinged parts are used as an example for description. In an embodiment in which there are a plurality of hinged parts, the beam body is divided into a multi-segment structure by the hinged parts and may be bent a plurality of times, to adapt to framework structures of different volumes. In this embodiment, there are two hinged parts, and the first beam body and the second beam body each are divided into three parts. In other implementations, there is one hinged part, and the first beam body and the second beam body each include two main beams and are connected by using the hinged part. When the two main beams are folded in half after being bent by using the hinged part, the two main beams may be overlapped in terms of projections, so that the two side frames are completely placed in layers.

Further, the first beam body and the second beam body each include two connection bases and a main beam connected between the two connection bases, and the two connection bases are respectively connected to the two side frames. The hinged part includes a rotating body 16, two first rotors 17, and two second rotors 18, where the first rotor 17 or the second rotor 18 is disposed at two opposite ends of the main beam 15, and the first rotor 17 and the second rotor 18 are rotatably connected by using the rotating body 16; and the second rotor 18 or the first rotor 17 extends from an end part of the connection base 14 towards the first rotor 17 or the second rotor 18.

In an embodiment, the first beam body 11a and the first beam body 11b, and the second beam body 12a and the second beam body 12b have a same structure and each include two connection bases 14 and a main beam 15 connected between the two connection bases 14. In this embodiment, the first rotor 17 is disposed at two opposite ends of the main beam 15, and the second rotor 18 extends from the end part of the connection base 14 towards the first rotor 17. The first rotor 17 and the second rotor 18 may rotate relative to the rotating body 16, thereby driving the main beam 15 to bend relative to the connection base 14. When the main beam 15 is bent 90 degrees, the side frame 10A and the side frame 10B are stacked, and an extension direction of the main beam 15 is parallel to the surfaces of the side panels 101 of the side frames. In this embodiment, the two connection bases 14 are used to be rotatably connected to the main beam 15, thereby ensuring bearing strength of the main beam 15 and stability of connection between the main beam 15 and the two side frames.

Figure 4:
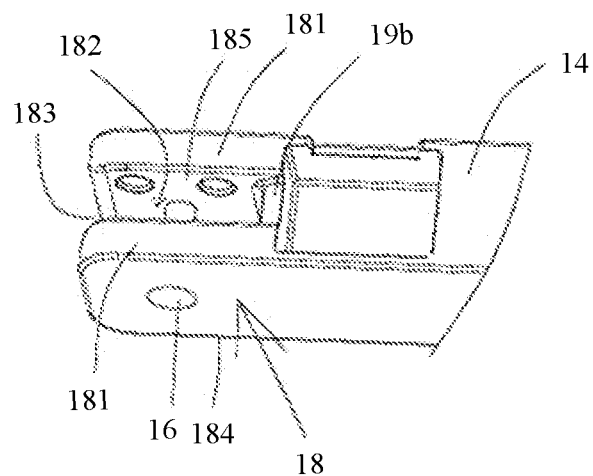
FIG. 4 is a schematic structural diagram of a first embodiment that is of a connection base and that includes a second rotor shown in FIG. 3.
Figure 5:
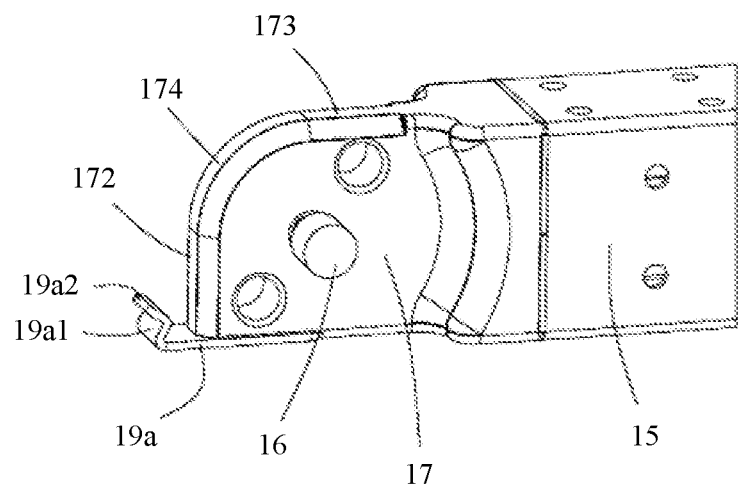
FIG. 5 is a schematic structural diagram of a first embodiment that is of a first rotor and that includes a part of the main beam shown in FIG. 3.
Figure 6:
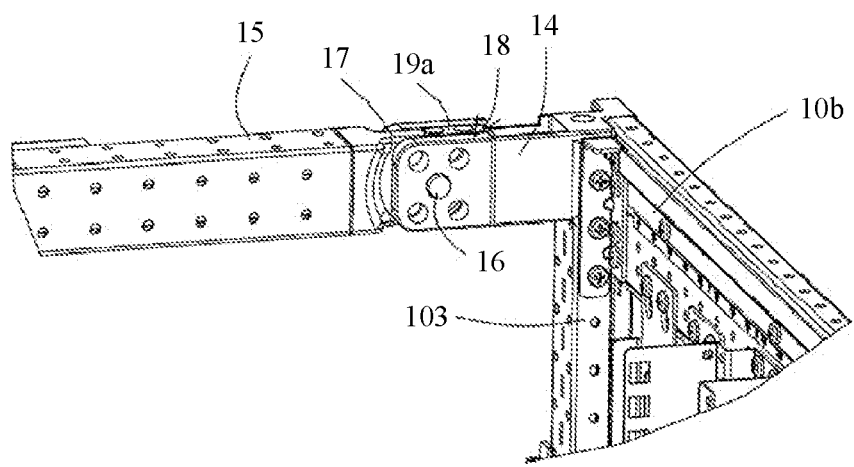
FIG. 6 is a partial schematic diagram of connecting the main beam and the connection base of the beam body shown in FIG. 3 by using a hinged part.

As shown in FIG. 4, FIG. 5, and FIG. 6, in an embodiment of the present disclosure, the second rotor 18 includes two side walls 181 spaced apart and disposed opposite to each other and an insertion groove 182 disposed between the two side walls 181, the insertion groove 182 includes an insertion opening 183 that faces the first rotor 17, a first turning opening 184, and a second turning opening 185, and the first turning opening 184 and the second turning opening 185 face directions perpendicular to an opening of the insertion opening 183 and face opposite directions. The first rotor 17 is inserted into the insertion groove 182 from the insertion opening 183 and is rotatably connected to the two side walls 181 of the second rotor 18 by using the rotating body 16, and the first rotor 17 rotates from the insertion opening 183 to the first turning opening 184 or the second turning opening 185, so that the main beam 15 is bent relative to the connection base 14. When the first beam body 11a is straightened to be presented as a straight rod body, the first rotor 17 is located in the insertion opening 183, and a length extension direction is the same as an extension direction of the side wall 181. The side wall 181 and the first rotor are fastened by using a locking structure such as a screw, and in this way, the main beam 15 and the connection base 14 form a complete rod body that is supported between the two side frames.

In an embodiment, the first beam 11a is used as an example for description. The main beam 15 of the first beam 11a is a rod body, a cross-sectional area of the first rotor 17 is less than or equal to that of the main beam 15, and the main beam 15 in this embodiment has a rectangular cross section, and may be hollow or solid. The first rotor 17 is rectangular flat-shaped, and is formed by extending from two opposite ends of the main beam 15 of the first beam body 11a along a length direction of the main beam 15. A length of the connection base 14 is less than that of the main beam 15, and the two connection bases 14 connect the main beam 15 and the side frames. The connection base 14 is in a shape of a block or rectangular body, and has a cross-sectional area the same as that of the main beam 15, in other words, a degree of thickness of the connection base 14 is the same as that of the main beam 15. An end face of the connection base 14 extends towards the main beam 15 to form the two rectangular flat-shaped side walls 181. One end of the side wall 181 is connected to the end face of the connection base 14, and the other three faces are all free end faces, so that the second rotor forms a groove having three openings. Actually, the second rotor may be considered as a part of the connection base 14, and the first rotor may be considered as a part of the main beam. A gap between the two side walls 181 is the insertion groove 182, the insertion groove 182 is a three-way opening groove, and the insertion opening 183 faces the main beam 15 (namely, an extension direction from the connection base 14 to the main beam 15) and is located between free end faces of the side walls 181. The first rotor 17 is inserted between the two side walls 181 from the insertion opening 183. The first turning opening 184 and the second turning opening 185 face opposite directions, are located on two opposite sides of the insertion opening 183, and communicate with the insertion opening 183. An included angle is set between a facing direction of the insertion opening 182 and a facing direction of each of the first turning opening 184 and the second turning opening 185. In an embodiment, the included angle is 90 degrees. The rotating body 16 is a rotating structure such as a rotating shaft or a pin, and connects the first rotor 17 and the two side walls 181, so that the first rotor 17 may rotate relative to the two side walls 181. Alternatively, the two side walls 181 may rotate relative to the first rotor 17. When the first rotor 17 rotates from the insertion opening 182 to the first turning opening 184 and the second turning opening 185, a maximum angle is 90 degrees, so as to prevent the main beam from being damaged due to excessive rotation. Certainly, the maximum angle of 90 degrees is not an absolute value, and a specific tolerance may be allowed around the 90-degree angle. When the two connection bases 14 connected to the same main beam 15 rotate and are bent by using the hinged parts, bending directions of the main beam 15 and the two connection bases 14 are opposite, and the first rotor 17 at one end of the main beam 15 rotates towards the first turning opening, and in this case, the first rotor 17 at the other end rotates towards the second turning opening, so that the length direction of the main beam 15 is perpendicular to length directions of the two connection bases.

As shown in FIG. 8, FIG. 9, FIG. 10, and FIG. 11, when the cabinet framework is transported or delivered from a factory, the first beam body and the second beam body are in a bent state, and the two side frames are disposed in a superposed manner. Specifically, the first rotor 17 of each of the first beam body and the second beam body slides from the insertion opening 182 to the first turning opening 184 and rotates relative to the connection base 14, so that the side frame 10A moves towards the side frame 10B until the side frame 10A is superposed with the side frame 10B. In this process, because the main beam 15 rotates relative to the connection base 14 to drive the side frame 10A to be displaced, one end that is of the side frame 10A and that is provided with a beam body protrudes out of the side frame 10B, the side frame 10A is partially overlapped with a part of the side frame 10B, the main beam 15 is stacked in layers on a protruding part of the side frame 10A, and a length extension direction of the protruding part is the same as a length direction of the side panel 101 of the side frame, and is perpendicular to the length direction of the main beam 15. The connection base is located between the superposed side frame 10A and the side frame 10B, and the first rotor 17 stops after rotating to a position in which the first turning opening 184 is located at an end face of the connection base 14. In this way, an overall volume of the cabinet framework is reduced, and the cabinet framework may be equivalent to being flat-shaped, which facilitates packaging and transportation. When the cabinet is assembled, the first beam body and the second beam body are straightened, so that the first rotor 17 rotates in the insertion groove 182 of the second rotor 18 until the extension direction of the main beam 15 is the same as the extension direction of the connection base 14. In this process, the side frame 10A is far away from the side frame 10B until the main beam 15 and the connection base 14 form a straight rod that is supported between the side frame 10A and the side frame 10B, and then the first rotor and the second rotor 18 are locked by using a locking structure such as a screw, to prevent the main beam 15 from rotating relative to the connection base 14, and the first beam body 11a and the first beam body 11b, the second beam body 12a and the second beam body 12b, the column 102, and the column 103 form a cuboid space. In this way, the three-dimensional framework is assembled. The first rotor 17 may also rotate towards the second turning opening 185.

A friction force may be set between the side walls 181 of the first rotor 17 and the second rotor 18. Alternatively, a structure that increases a friction force is disposed between the rotating shaft and the side panel 101, so as to implement pre-positioning of the main beam 15 and the connection base 14 in a bent or straightened state. The main beam 15 rotates relative to the two connection bases 14 to implement bending of the first beam body 11a, which may drive the side panel 101 of the side frame 10A to approach the side panel 101 of the side frame 10B and to be stacked on the side frame 10B. In this embodiment, the second rotor 18 on the connection base 14 with a shorter length is disposed in a way that two side walls 181 are used to clamp the first rotor 17. From a perspective of force bearing, the two side walls 181 are of a U-shaped structure to receive the first rotor 17 in a shape similar to I, so that bearing strength of the second rotor 18 can be ensured, and the entire connection base 14 and the main beam 15 have sufficient bearing strength.

In an embodiment, a structure of the first rotor 17 is the same as that of the second rotor 18, and one sidewall 181 of the first rotor 17 is inserted into the insertion groove 182 of the second rotor 18 from the insertion opening 183 of the second rotor 18. One side wall 181 of the second rotor 18 is inserted into the insertion groove 182 of the first rotor 17, and the rotating body is rotatably connected to the two side walls 181 of the second rotor 18 and the two side walls 181 of the first rotor 17. The first rotor 17 rotates relative to the second rotor 18, and the side wall 181 of the second rotor 18 rotates from the insertion opening 183 of the first rotor 17 to the first turning opening 184 or the second turning opening 185 of the first rotor 17. The side wall 181 of the first rotor 17 rotates from the insertion opening 183 of the second rotor 18 to the first turning opening 184 or the second turning opening 185 of the second rotor 18, so that the main beam 15 is bent relative to the connection base 14. In this embodiment, the first rotor 17 includes the insertion groove 182 facing the second rotor 18 and the two side walls 181, the side walls 181 of the first rotor 17 and the second rotor 18 form U-shaped structures, and the two U-shaped structures are plug-connected to each other, so as to form a hinged part that is securely hinged.

Further, a turning limiting surface 145 disposed opposite to the insertion opening 183 is disposed between the two side walls 181, and the turning limiting surface 145 in this embodiment is an end face that is of the connection base 14 and that is extended from the two side walls 181. The first rotor 17 includes a first limiting surface 172 and a second limiting surface 173 that is connected to the first limiting surface 172 at an included angle, and the first rotor 17 is located in the insertion groove 182. The turning limiting surface 145 is opposite to or abuts against the first limiting surface 172, and abuts against the second limiting surface 173 after the first rotor 17 rotates. The limiting surface may be disposed to prevent the main beam 15 from being damaged due to an excessively large rotation angle when the main beam 15 and the connection base 14 rotate.

In an embodiment, when the first rotor 17 is rectangular flat-shaped, the first limiting surface 172 and the second limiting surface 173 are two connected outer surfaces of the first rotor 17, and the first limiting surface 172 is a free end face that is of the first rotor 17 and that is far away from the main beam 15. The second limiting surface 173 is a side surface connected to the first limiting surface 172 at an included angle. The included angle between the first limiting surface 172 and the second limiting surface 173 is 90 degrees, or the first limiting surface 172 and the second limiting surface 173 are connected at an arched angle. In this embodiment, the first limiting surface 172 is connected to the second limiting surface 173 at the arched angle 174, and the arched angle 174 is in a convex arched shape. When the first rotor 17 rotates in the insertion groove 182 of the second rotor 18, the arched angle can improve a degree of smoothness of the rotation of the first rotor 17, and prevent the first rotor 17 from friction with the turning limiting surface 145. When the first rotor 17 includes the two side walls 181, the first limiting surface 172 and the second limiting surface 173 are disposed on a side wall 181 inserted into the insertion groove 182 of the second rotor 18.

In an embodiment, structures of the second rotor 18 and the first rotor 17 each are flat-shaped, and each are provided with a bearing, which is not shown in the figure. The rotating body 16 is a rotating shaft. The rotating shaft is installed on the bearing, so that the first rotor 17 and the second rotor 18 are disposed opposite to each other and are rotatable. An axis of the bearing is perpendicular to opposite surfaces of the first rotor 17 and the second rotor 18, which may be in contact with each other and perpendicular to the axis of the bearing, and the rotating shaft and the bearing are positioned by using a friction force. Certainly, the first rotor 17 and the second rotor 18 may be positioned by using a clamping part.

Figure 7:
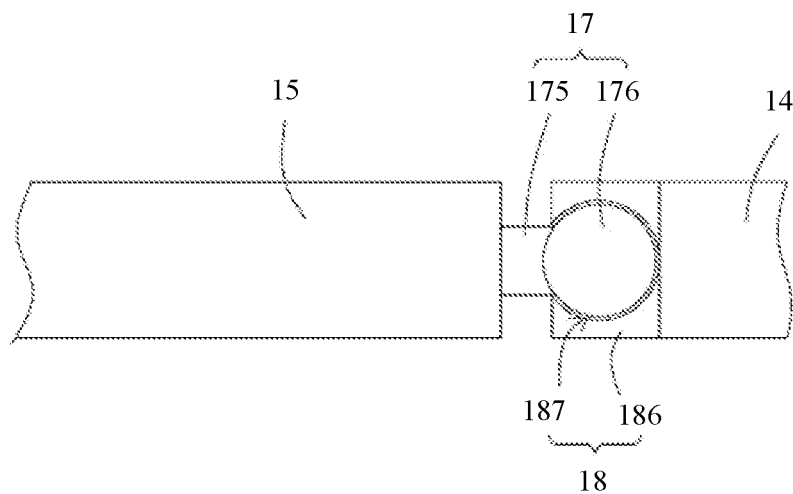
FIG. 7 is a schematic plan view of a second embodiment of a hinged part of the cabinet framework shown in FIG. 1.
Figure 8:
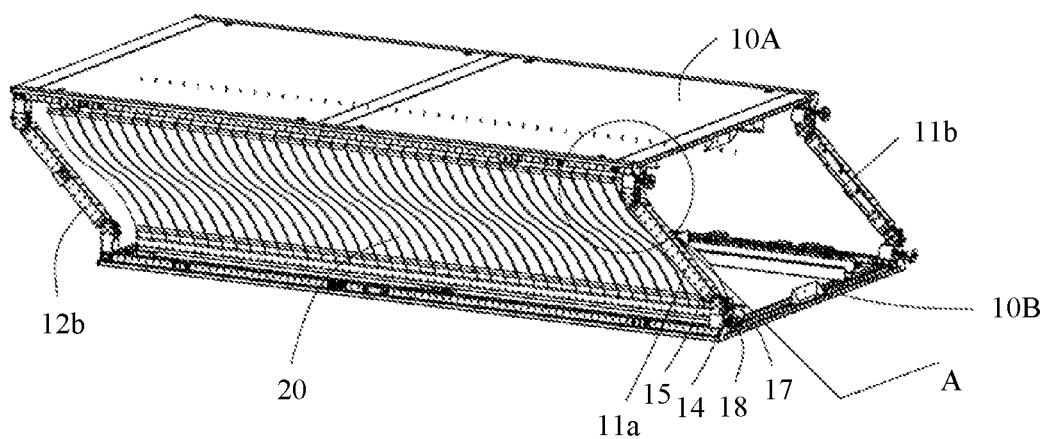
FIG. 8 is a schematic state diagram of a process in which the beam body of the cabinet framework shown in FIG. 1 is bent so that two side frames are superposed.
Figure 9:
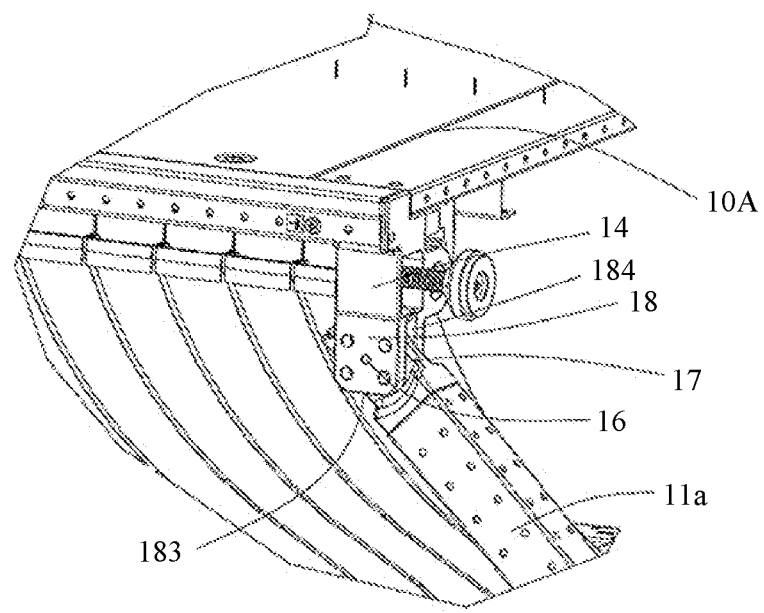
FIG. 9 is an enlarged diagram of a part A in FIG. 8, and is a state diagram of rotation of a first rotor and a second rotor that connect a main beam and a connection base.
Figure 10:
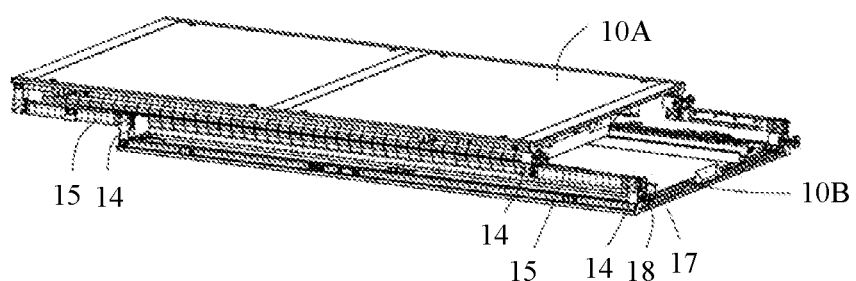
FIG. 10 is a schematic diagram of superposing two side frames of the cabinet framework shown in FIG. 1.
Figure 11:
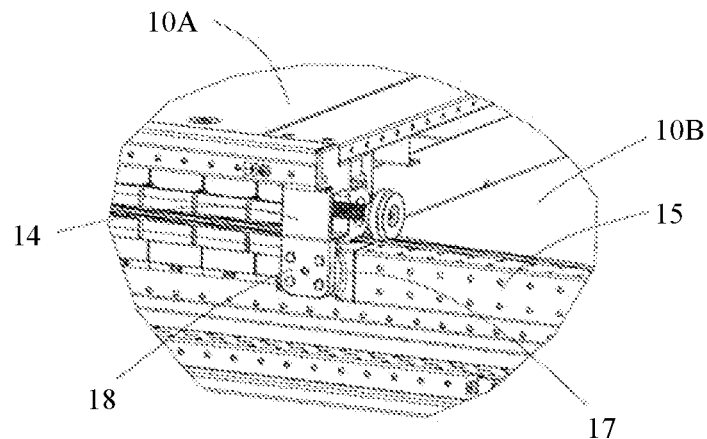
FIG. 11 is a state diagram of a first rotor and a second rotor that connect a main beam and a connection base after the two side frames are superposed in FIG. 10.

In an embodiment, as shown in FIG. 7, the first rotor 17 includes a body 175 and a sphere 176 located at a free end of the body 175, the second rotor 18 includes two side walls 186 spaced apart and disposed opposite to each other, opposite surfaces of the two side walls 186 are provided with an arched limiting groove 187 jointly formed by being concavely disposed in the side walls 186, and the limiting groove 187 is a three-way opening groove. The sphere of the first rotor 17 is rotatably installed in the limiting groove 187 by using a rotating body that penetrates through the side wall 186, and can rotate in the limiting groove 187. The body 175 protrudes from an opening that is of the limiting groove 187 and that faces the first rotor 17, and the first rotor 17 rotates from the opening to another opening of the three-way opening, so that the main beam 15 is bent relative to the connection base 14. The sphere 175 rotates in the arched limiting groove 176, which may increase a degree of smoothness of the rotation of the hinged part. Specifically, the surface of the side wall 186 is concavely disposed to form an arched recess, the limiting groove is jointly formed by the arched recesses of the two side walls, an opening section that is of the limiting groove 176 and that faces the first rotor 17 has a same shape as a cross section of the body, and the other two openings of the limiting groove are nearly circular.

Referring to FIG. 3 and FIG. 5, further, the hinged part includes a first clamping body 19a disposed on the first rotor 17 and a second clamping body 19b disposed on the second rotor 18, the first beam body and the second beam body are supported between the two side frames, and the first clamping body 19a and the second clamping body 19b perform clamping to limit the main beam 15 to be bent relative to the two connection bases 14 by using the hinged part. The first clamping body 19a and the second clamping body 19b can perform clamping to implement a straight line connection between the main beam 15 and the connection bases 14, namely, a function of pre-clamping and positioning after a beam body 15 is straightened, so that the main beam 15 and the connection bases 14 can be kept in a straight line state. In this way, it is convenient for assembly personnel to fasten the first rotor 17 and the second rotor 18 by using a screw or the like, thereby facilitating assembly and also ensuring assembly precision.

The first clamping body 19a or the second clamping body 19b is an elastic body, one end of the elastic body is bent to form a protrusion, and the second clamping body 19b or the first clamping body 19a corresponding to the elastic body is provided with a clamping groove for clamping the protrusion; or the first clamping body 19a or the second clamping body 19b is an elastic retaining ring, the second clamping body 19b or the first clamping body 19a corresponding to the elastic retaining ring is a boss, and the elastic retaining ring is sleeved on the boss. In this embodiment, the first clamping body 19a is an elastic body of a long strip metal, one end of the elastic body is bent to form a protrusion 19a1, the other end of the elastic body is fastened to a face that is of the first rotor 17 and that faces a rotation direction, and the second clamping body 19b is a clamping groove, and is concavely disposed on a face that is of the second rotor 18 and that is opposite to the rotation direction of the first rotor 17. In an embodiment, one end of the elastic body bends inwards the elastic body to form a convex hull, then bends in a convex direction of the convex hull to form the protrusion 19a1, and then a clamping end 19a2 bends in a direction away from the elastic body. Embodiment 2 is used as an example. The elastic body is fastened to a side surface that is of the first rotor 17 and that is opposite to the second limiting surface 173, and the clamping groove 19b is concavely disposed on one side that is of the connection base 14 and that is located in the second turning opening 185. A recess is disposed on a side that is of the clamping groove 19b and that is away from the second turning opening 185, the clamping end 19a2 is clamped in the recess, and after the main beam 15 recovers to an unbent state, the protrusion of the elastic body is clamped in the clamping groove, the first rotor 17 on which the first clamping body is disposed can rotate only towards the first turning opening 184. However, when the first clamping body 19a and the second clamping body 19b perform clamping, the first rotor 17 cannot rotate. In another embodiment, the main beam 15 and the two connection bases 14 are limited by a friction force between the first rotor 17 and the second rotor 18. Positions of the first clamping body 19a and the second clamping body 19b are not limited to positions listed in this embodiment, or may be other positions, provided that the rotation and displacement of the main beam 15 are not affected when the main beam 15 rotates relative to the connection base 14, and positioning of the first clamping body 19a and the second clamping body 19b can be implemented.

Further, the connection base 14 and the column are integrally formed, or are detachably connected. When the connection base 14 and the column are integrally formed, processing of the connection base 14 is facilitated. When the connection base 14 and the column are detachably connected, the connection base 14 may be first assembled with the main beam 15 by using the hinged part and then assembled with the side frame, so as to facilitate assembly of the first beam body and the second beam body.

Further, as shown in FIG. 1, the cabinet framework further includes a flexible panel 20 connected between the two side frames, where the flexible panel 20 includes several elastic seals 21 disposed side by side, and when the two side frames are superposed with each other, the elastic seals 21 are freely deformed. The two side frames are disposed opposite to each other, columns of the side frame 10A and the side frame 10B are parallel and opposite to each other to form a frame door of the framework, and the flexible panel 20 is located on an inner side of the frame door of the framework. The elastic seal is an elastic steel rod, and two ends of the elastic seal are respectively fastened to the side panels 101 of the side frame 10A and the side frame 10B; or the elastic seal is made of a spring or a flexible material, and is connected to the side frame 10A and the side frame 10B by using a universal rotating shaft. When the side frame 10A and the side frame 10B are superposed with each other, the elastic seal may freely rotate and be folded.

Figure 12:
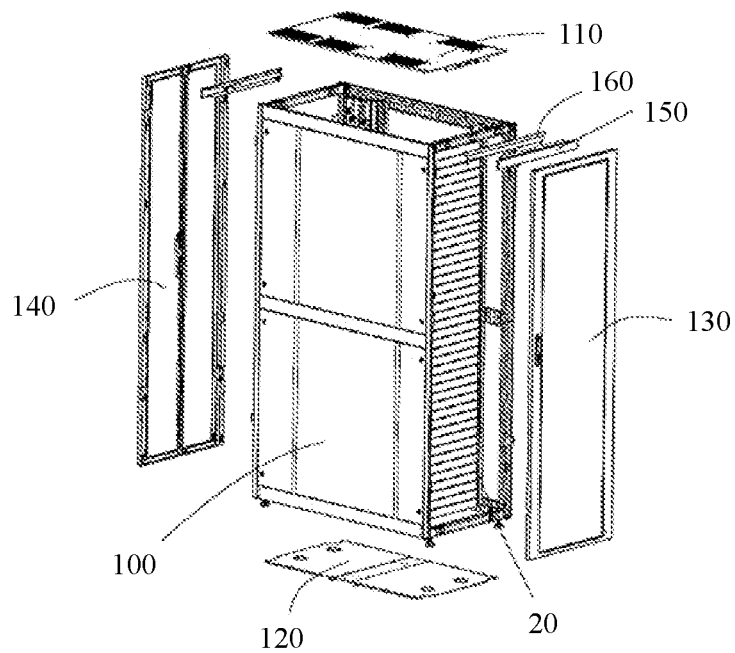
FIG. 12 is a schematic exploded view of a structure of a cabinet including a cabinet framework according to the present disclosure.

Referring to FIG. 12, an embodiment of the present disclosure further provides a cabinet. The cabinet includes the foldable cabinet framework 100, a top plate 110, a bottom plate 120, a front door 130, and a rear door 140 described in any one of the foregoing embodiments, the front door 130 and the rear door 140 are installed between the two side frames: 10A and 10B and are disposed opposite to each other, and enclose an accommodation space with the side frame 10A and the side frame 10B. The top plate 110 and the bottom plate 120 package the accommodation space. The front door 130 and the rear door 140, the top plate 110 and the bottom edge 120, and the two side panels enclose a rectangular box structure and have an accommodation space for accommodating network communications devices such as a server and a console. Specifically, the top plate 110 and the bottom plate 120 are fastened to the side frame, the first beam body, and the second beam body. The cabinet further includes an air baffle 150 and a door header 160. The air baffle 150 and the door header 160 package the top plate 110 and the first beam body, and are used as seals between the top plate 110 and each of the front door 130 and the rear door 140. The air baffle 150 blocks the first beam body 11a above the front door between the side frame 10A and the side frame 10B. An air exhaust hole is disposed on the top plate 160, and is configured to connect the accommodation space to the outside. Certainly, a through hole on the top plate 160 may also be a cable access hole.

The framework of the cabinet in this embodiment of the present disclosure may be deformed and folded to form a horizontal structure, and the front door 130 and the rear door 140, the top plate 110, and the bottom edge 120 may be removed during packaging or transportation, so that occupied space is reduced to facilitate transportation and overall costs of the cabinet are reduced. During assembly of the cabinet, assembly of the framework can be completed as long as the beam body is straightened, and then an assembly speed can be greatly increased when the flat-shaped front door 130 and rear door 140, the top plate 110, and the bottom edge 120 are assembled.

What is claimed is:

1. A foldable cabinet framework, comprising:
   two side frames;
   a first beam body having a first hinged part and two opposite ends respectively connected to the two side frames; and
   a second beam body having a second hinged part and two opposite ends respectively connected to the two side frames,
   wherein when the first beam body and the second beam body are in a straight state, the first beam body and the second beam body are supported between the two side frames, so that the two side frames are spaced apart and symmetrically disposed, and the first beam body, the second beam body, and the two side frames enclose a framework of a three-dimensional structure, and
   wherein the first beam body and the second beam body are foldable via the first hinged part and the second hinged part respectively, and after the first beam body and the second beam body are folded, the two side frames are superposed with each other,
   wherein each of the first beam body and the second beam body comprises a connection base and a main beam coupled to the connection base, wherein the connection bases of the first and second beam bodies are respectively connected to the two side frames,
   wherein each of the first and second hinged parts comprises a rotating body, a first rotor, and a second rotor, wherein the first rotor and the second rotor are rotatably connected through the rotating body, the first rotor or the second rotor is disposed at two opposite ends of the main beam, and the second rotor or the first rotor extends from an end part of the connection base towards the first rotor or the second rotor, and
   wherein each hinged part comprises a first clamping body disposed on the first rotor and a second clamping body disposed on the second rotor, the first beam body and the second beam body are supported between the two side frames, and the first clamping body and the second clamping body clamp to limit the main beam to be bent relative to the connection base by using the hinged part.

2. The foldable cabinet framework according to claim 1, wherein after the first beam body and the second beam body are folded, the two side frames are at least partially overlapped.

3. The foldable cabinet framework according to claim 1, wherein each of the first hinged part and the second hinged part divides a corresponding one of the first beam body and second beam body into two parts that are bendable relative to each other.

4. The foldable cabinet framework according to claim 1, wherein the second rotor comprises:
   two side walls spaced apart and disposed opposite to each other; and
   an insertion groove disposed between the two side walls, wherein the insertion groove comprises an insertion opening that faces the first rotor, a first turning opening, and a second turning opening, wherein the first turning opening and the second turning opening face directions perpendicular to an opening of the insertion opening and face opposite directions,
   wherein the first rotor is inserted into the insertion groove from the insertion opening and is rotatably connected to the two side walls through the rotating body, and the first rotor rotates from the insertion opening to the first turning opening or the second turning opening, so that the main beam is bent relative to the connection base.

5. The foldable cabinet framework according to claim 4, wherein a structure of the first rotor is the same as that of the second rotor, a side wall of the first rotor is inserted into the insertion groove of the second rotor from the insertion opening of the second rotor, and one of the side walls of the second rotor is inserted into an insertion groove of the first rotor, and the rotating body is rotatably connected to the two side walls of the second rotor and two side walls of the first rotor; and
   the first rotor rotates relative to the second rotor, and the inserted side wall of the second rotor rotates from the insertion opening of the first rotor to a first turning opening or a second turning opening of the first rotor, and the side wall of the first rotor rotates from the insertion opening of the second rotor to the first turning opening or the second turning opening of the second rotor, so that the main beam is bent relative to the connection base.

6. The foldable cabinet framework according to claim 1, wherein the first rotor comprises a body and a sphere located at a free end of the body, the second rotor comprises two side walls spaced apart and disposed opposite to each other, opposite surfaces of the two side walls are provided with an arched limiting groove jointly formed by being concavely disposed in the side walls, the limiting groove is a three-way opening groove, the sphere of the first rotor is rotatably installed in the limiting groove via a rotating body that penetrates through the side walls, and can rotate in the limiting groove, the body protrudes from an opening of the limiting groove facing the first rotor, and the first rotor rotates from the opening to another opening of the three-way opening groove, so that the main beam is bent relatively to the connection base.

7. The foldable cabinet framework according to claim 4, wherein a turning limiting surface disposed opposite to the insertion opening is disposed between the two side walls, the first rotor comprises a first limiting surface and a second limiting surface connected to the first limiting surface at an included angle, the first rotor is located in the insertion groove, and the turning limiting surface is opposite to the first limiting surface and abuts against the second limiting surface after the first rotor rotates.

8. The foldable cabinet framework according to claim 7, wherein the first limiting surface and the second limiting surface are connected with an arched angle, and when the first rotor rotates in the insertion groove, the arched angle rotates relative to the turning limiting surface.

9. The foldable cabinet framework according to claim 1, wherein the main beam is limited to the connection base by using a friction force.

10. The foldable cabinet framework according to claim 1, wherein bending angles of the first beam body and the second beam body are ranging 0-90 degrees.

11. The foldable cabinet framework according to claim 1, wherein there are two first beam bodies and two second beam bodies, each of the side frames comprises a side panel and columns disposed on two opposite edges of a surface of the side panel, the three-dimensional structure is a cube, wherein the two first beam bodies, the two second beam bodies, and the columns of the side frames are connected to form a frame with eight edges of the cube.

12. The foldable cabinet framework according to claim 11, wherein the connection base and the column are integrally formed, or are detachably connected.

13. The foldable cabinet framework according to claim 11, wherein the cabinet framework comprises a flexible panel connected between the two side frames, the flexible panel comprises a plurality of elastic seals disposed side by side, and when the two side frames are superposed with each other, the elastic seals are freely deformed.

14. A cabinet, comprising:
a foldable cabinet framework, wherein the foldable cabinet framework includes:
two side frames;
a first beam body having a first hinged part and two opposite ends respectively connected to the two side frames; and
a second beam body having a second hinged part and two opposite ends respectively connected to the two side frames,
wherein when the first beam body and the second beam body are in a straight state, the first beam body and the second beam body are supported between the two side frames, so that the two side frames are spaced apart and symmetrically disposed, and the first beam body, the second beam body, and the two side frames enclose a framework of a three-dimensional structure, and
wherein the first beam body and the second beam body are foldable via the first hinged part and the second hinged part respectively, and after the first beam body and the second beam body are folded, the two side frames are superposed with each other; and
a top plate, a bottom plate, a front door, and a rear door, wherein the front door and the rear door are installed between the two side frames and are disposed opposite to each other, and enclose an accommodation space with the side frames, the top plate and the bottom plate package the accommodation space,
wherein each of the first beam body and the second beam body comprises a connection base and a main beam coupled to the connection base, wherein the connection bases of the first and second beam bodies are respectively connected to the two side frames,
wherein each of the first and second hinged parts comprises a rotating body, a first rotor, and a second rotor, wherein the first rotor and the second rotor are rotatably connected through the rotating body, the first rotor or the second rotor is disposed at two opposite ends of the main beam, and the second rotor or the first rotor extends from an end part of the connection base towards the first rotor or the second rotor, and
wherein each hinged part comprises a first clamping body disposed on the first rotor and a second clamping body disposed on the second rotor, the first beam body and the second beam body are supported between the two side frames, and the first clamping body and the second clamping body clamp to limit the main beam to be bent relative to the connection base by using the hinged part.

15. The cabinet according to claim 14, wherein after the first beam body and the second beam body are folded, the two side frames are at least partially overlapped.

16. The cabinet according to claim 14, wherein each of the first hinged part and the second hinged part divides a corresponding one of the first beam body and second beam body into two parts that are bendable relative to each other.

* * * * *